(12) United States Patent
Riering-Czekalla et al.

(10) Patent No.: US 9,083,111 B2
(45) Date of Patent: Jul. 14, 2015

(54) MAGNETIC DOCKING BASE FOR HANDSET

(71) Applicant: Qwest Communications International Inc., Denver, CO (US)

(72) Inventors: Peter Riering-Czekalla, Oakland, CA (US); Afshin Mehin, North Vancouver (CA); Elger Oberwelz, San Francisco, CA (US); Adam Vollmer, San Francisco, CA (US); James Yurchenco, Palo Alto, CA (US); Matthew Robert Adams, Mountain View, CA (US); Andrew Switky, Menlo Park, CA (US)

(73) Assignee: Qwest Communications International Inc., Denver, CO (US)

( * ) Notice: Subject to any disclaimer, the term of this patent is extended or adjusted under 35 U.S.C. 154(b) by 222 days.

(21) Appl. No.: 13/722,902

(22) Filed: Dec. 20, 2012

(65) Prior Publication Data

US 2013/0164949 A1   Jun. 27, 2013

Related U.S. Application Data

(60) Provisional application No. 61/579,884, filed on Dec. 23, 2011.

(51) Int. Cl.
*H01R 11/30* (2006.01)
*H01R 13/62* (2006.01)

(52) U.S. Cl.
CPC .................................. *H01R 13/6205* (2013.01)

(58) Field of Classification Search
CPC ............... H01R 13/6205; H01R 11/30; H01R 13/7037; H01R 13/70; H01R 13/514; H01R 13/703

USPC ........................................................ 439/38, 39
See application file for complete search history.

(56) References Cited

U.S. PATENT DOCUMENTS 3,810,258 A * 5/1974 Mathauser ...................... 439/39
4,166,663 A * 9/1979 Walker et al. .................. 439/289
(Continued)

FOREIGN PATENT DOCUMENTS

DE         4009021 A1    9/1991

OTHER PUBLICATIONS

U.S. Appl. No. 13/722,891, filed Dec. 20, 2012, 21 pages.
(Continued)

*Primary Examiner* — Xuong Chung Trans
(74) *Attorney, Agent, or Firm* — Swanson & Bratschun, L.L.C.

(57) ABSTRACT

Novel tools and techniques are described for coupling electronic devices with docking stations. In one aspect, a coupling system comprises a first material in the docking station and a second material in the electronic device. The first material and the second material may each comprise at least one magnet and/or at least one ferromagnetic material that interact magnetically to align the electronic device in an appropriate position with respect to the docking station. The docking station comprises a first set of electrical contacts and the electronic device comprises a second set of electrical contacts. When in the appropriate position, the first set of electrical contacts electrically couples with the second set of electrical contacts. The shapes of the first and second electrical contacts, and the polarities of the magnets/ferromagnetic materials, may be configured to facilitate electrical coupling while avoiding mismatching of the positive/negative terminals of the electrical contacts.

20 Claims, 6 Drawing Sheets

(56) References Cited

U.S. PATENT DOCUMENTS

| | | | |
|---|---|---|---|
| 5,573,107 A * | 11/1996 | Nakano et al. | 200/314 |
| 7,311,526 B2 * | 12/2007 | Rohrbach et al. | 439/39 |
| 7,341,458 B1 * | 3/2008 | Koh | 439/39 |
| 7,775,801 B2 * | 8/2010 | Shiff et al. | 439/39 |
| 7,839,120 B2 * | 11/2010 | Elizalde Rodarte | 320/115 |
| 7,957,326 B1 | 6/2011 | Christie, IV | |
| 8,535,088 B2 * | 9/2013 | Gao et al. | 439/490 |
| 8,907,781 B2 | 12/2014 | Tomooka et al. | |
| 8,940,424 B2 | 1/2015 | Joye et al. | |
| 2001/0001083 A1 | 5/2001 | Helot | |
| 2002/0078291 A1 | 6/2002 | Sutton et al. | |
| 2002/0117789 A1 | 8/2002 | Childers et al. | |
| 2002/0160806 A1 | 10/2002 | Arazi et al. | |
| 2003/0059024 A1 | 3/2003 | Meyerson et al. | |
| 2003/0104714 A1 | 6/2003 | Yeh | |
| 2003/0235029 A1 | 12/2003 | Doherty et al. | |
| 2005/0174727 A1 | 8/2005 | Thomas et al. | |
| 2006/0185822 A1 | 8/2006 | Glezer et al. | |
| 2007/0263828 A1 | 11/2007 | Lee et al. | |
| 2007/0297426 A1 | 12/2007 | Haveson et al. | |
| 2008/0004002 A1 | 1/2008 | Chin et al. | |
| 2008/0058010 A1 | 3/2008 | Lee | |
| 2008/0081580 A1 | 4/2008 | Cole | |
| 2008/0231545 A1 | 9/2008 | Gong | |
| 2009/0143053 A1 | 6/2009 | Levien et al. | |
| 2009/0233542 A1 | 9/2009 | Gratton et al. | |
| 2009/0320073 A1 | 12/2009 | Reisman | |
| 2010/0118158 A1 | 5/2010 | Boland et al. | |
| 2010/0131691 A1 | 5/2010 | Chatterjee et al. | |
| 2010/0203833 A1 | 8/2010 | Dorsey | |
| 2011/0276885 A1 | 11/2011 | Gibson et al. | |
| 2012/0057295 A1 | 3/2012 | Simpson et al. | |
| 2012/0293924 A1 | 11/2012 | Dolci et al. | |
| 2012/0303476 A1 | 11/2012 | Krzyzanowski et al. | |
| 2013/0107445 A1 | 5/2013 | Reber et al. | |
| 2013/0162211 A1 | 6/2013 | Yurchenco et al. | |
| 2013/0279109 A1 | 10/2013 | Lindblad et al. | |
| 2014/0295758 A1 | 10/2014 | Pedersen | |

OTHER PUBLICATIONS

U.S. Appl. No. 13/722,908, filed Dec. 20, 2012, 33 pages.

U.S. Appl. No. 12/773,742; NonFinal Office Action dated May 20, 2013; 29 pages.

U.S. Appl. No. 12/773,742; Final Office Action dated Nov. 7, 2013; 67 pages.

U.S. Appl. No. 12/773,742; NonFinal Office Action dated Apr. 23, 2014; 36 pages.

U.S. Appl. No. 13/722,891; Notice of Publication dated Jun. 27, 2013; 1 page.

U.S. Appl. No. 12/773,742 Notice of Publication dated Nov. 10, 2011; 1 page.

U.S. Appl. No. 12/773,742; Final Office Action dated Aug. 13, 2014; 26 pages.

U.S. Appl. No. 13/722,891; NonFinal Office Action dated Dec. 9, 2014; 26 pages.

U.S. Appl. No. 13/722,891; Final Office Action dated Jun. 3, 2015; 22 pages.

\* cited by examiner

MAGNETIC DOCKING BASE FOR HANDSET

CROSS-REFERENCES TO RELATED APPLICATIONS

This application claims priority to U.S. Provisional Patent Application No. 61/579,884, filed Dec. 23, 2011, by Riering-Czekalla et al. and titled, "MAGNETIC DOCKING BASE FOR HANDSET" which is hereby incorporated by reference, as if set forth in full in this document, for all purposes.

The present disclosure may also be related to the following commonly assigned application(s)/patent(s):

U.S. patent application Ser. No. 12/773,742, filed May 4, 2010 by Gibson et al. and titled, "Multi-Client Local Network Base Station" (published as US PG Pub. No. 2011/0276885 A1 on Nov. 10, 2011) (hereinafter, the "'742 Application"), which is incorporated herein by reference in its entirety;

U.S. patent application Ser. No. 13/722,891 filed on a date even herewith by Yurchenco et al. and titled "Charging Contact System", which claims priority to provisional U.S. Patent Application No. 61/580,051, filed on Dec. 23, 2011, both of which are incorporated by reference herein in their entirety; and U.S. patent application Ser. No. 13/722,908 filed on a date even herewith by Switky et al. and titled "Passive Suction Base", which claims priority to provisional U.S. Patent Application No. 61/579,886, filed on Dec. 23, 2011 both of which are incorporated by reference herein in their entirety.

The respective disclosures of these applications/patents are incorporated herein by reference in their entirety for all purposes.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to coupling portable devices to docking bases, and more particularly, to coupling electronic devices to magnetic docking stations.

BACKGROUND

Traditionally, docking bases for portable devices, such as portable handsets for telephones, have comprised molded carriages that cradle the portable handsets, by generally conforming to a shape of at least a portion of the handset. As a result, the handset may be positioned in the cradle of the docking base in only one orientation, so that contacts on the handset make contact with corresponding contacts on the docking base. The contacts on the docking base are thus always positioned to deliver power to the handset when the handset is docked with the docking base (i.e., with the contacts on the handset in contact with the contacts on the docking base).

Although such a configuration almost guarantees that the corresponding contacts will mate when the portable handset is docked, such a configuration necessarily limits the directions in which the portable handset may be docked and undocked to one single direction. At the same time, because of the limitations in terms of the directions in which the handset may be docked or undocked, the process of docking the handset becomes necessarily cumbersome and inelegant.

The embodiments disclosed herein are directed toward overcoming one or more of the problems discussed above.

BRIEF SUMMARY

Various embodiments provide tools and techniques to enable coupling of electronic devices to docking bases, while allowing for freedom of motion in docking and undocking the portable devices. In some embodiments, the electronic device(s) may be docked and/or undocked from the docking station in any direction above a (generally flat) charging surface of the docking station.

According to some embodiments, the docking station and the electronic device(s) may each comprise complementary magnets/magnetic materials that magnetically align the electronic device(s) in appropriate positions relative to the docking station, when docked. A first set of electrical contacts may be provided in the docking station that electrically couples with a second set of electrical contacts that may be provided in the electronic device(s), so as to power the electronic device(s) and/or to charge one or more batteries therein when docked in the appropriate position. Data transfer contacts may similarly be provided in the docking station and the electronic device(s) to allow transfer of data between the docking station and the electronic device(s), when docked in the appropriate position(s).

In one aspect, a coupling system, in accordance with some embodiments, may be provided that comprises a first material in the docking station and a second material in the electronic device. The first material and the second material may each comprise at least one magnet and/or at least one magnetic material that interact magnetically to align the electronic device in an appropriate position with respect to the docking station. The docking station, according to some embodiments, may comprise a first set of electrical contacts and the electronic device may comprise a second set of electrical contacts. When in the appropriate position, the first set of electrical contacts may be electrically coupled with the second set of electrical contacts. The shapes of the first and second electrical contacts, and/or the polarities of the magnets/magnetic materials, may be configured to facilitate electrical coupling while avoiding mismatching of the positive/negative terminals of the electrical contacts.

In another aspect, a docking station, according to some embodiments, may be provided that comprises a first set of electrical contacts and a coupling system configured to magnetically align an electronic device in an appropriate position relative to the docking station. The electronic device may comprise a second set of electrical contacts. The appropriate position may provide for electrical coupling between the first set of contacts and the second set of contacts. In some embodiments, the coupling system may comprise a first material configured to interact magnetically with a second material in the electronic device, to align the electronic device in the appropriate position. The docking station, in accordance with some embodiments, may further comprise a first data transfer contact configured to interact electrically with a second data transfer contact in the electronic device, to transfer data between the docking station and the electronic device.

Various modifications and additions can be made to the embodiments discussed without departing from the scope of the invention. For example, while the embodiments described above refer to particular features, the scope of this invention also includes embodiments having different combination of features and embodiments that do not include all of the above described features.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF CERTAIN EMBODIMENTS

Figure 1:
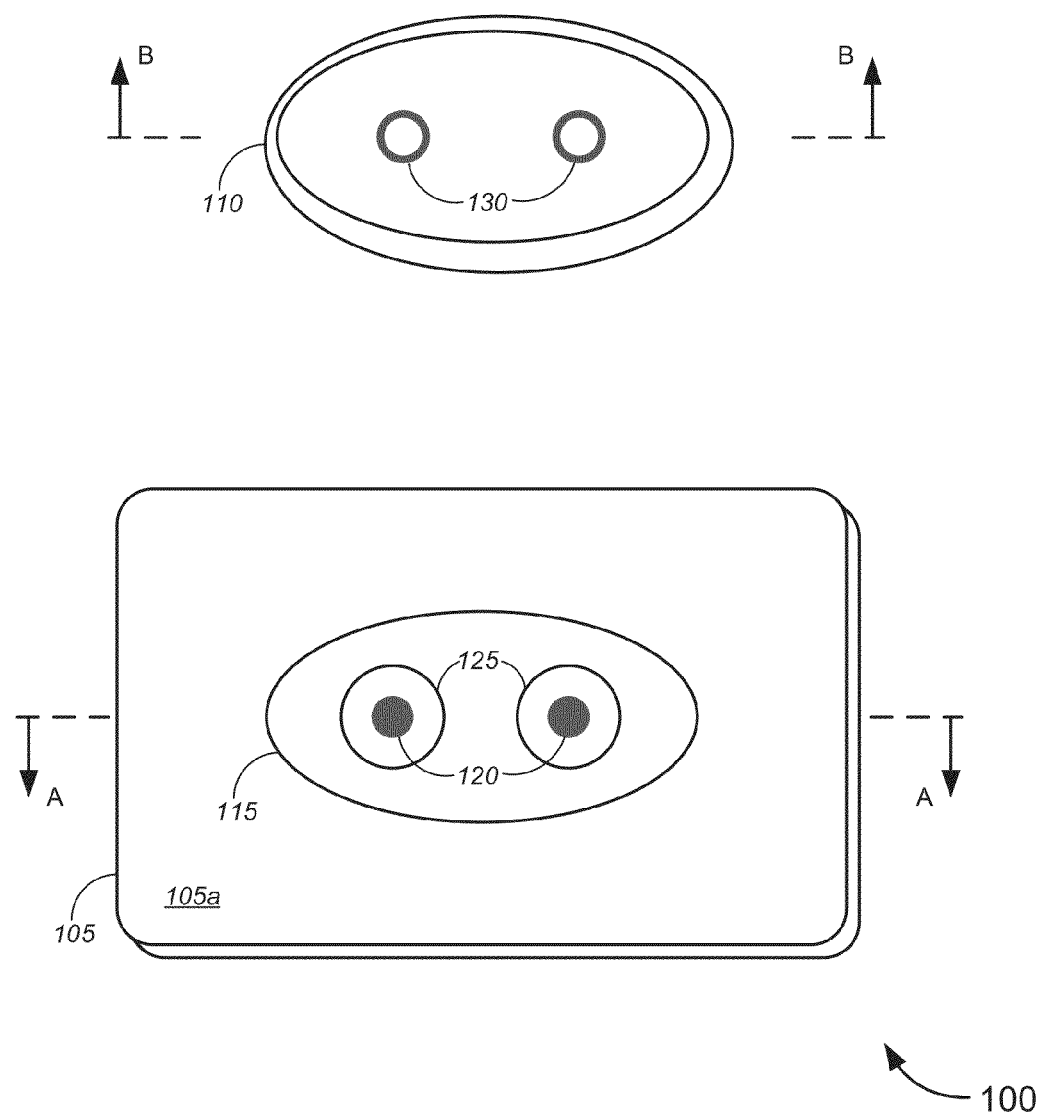
FIG. 1 is a generalized diagram illustrating a top perspective view of a docking station together with a bottom perspective view of a wireless handset, in accordance with various embodiments.

While various aspects and features of certain embodiments have been summarized above, the following detailed description illustrates a few exemplary embodiments in further detail to enable one of skill in the art to practice such embodiments. The described examples are provided for illustrative purposes and are not intended to limit the scope of the invention.

In the following description, for the purposes of explanation, numerous specific details are set forth in order to provide a thorough understanding of the described embodiments. It will be apparent to one skilled in the art, however, that other embodiments of the present invention may be practiced without some of these specific details. In other instances, certain structures and devices are shown in block diagram form.

Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

A set of embodiments provides novel docking and/or charging solutions for electronic devices. One embodiment can be employed in a tablet computer or similar device. Another embodiment can be employed in a telephone handset, a mobile telephone, a mobile smart phone, or similar device. Merely by way of example, the '742 Application describes a number of communication systems, including base stations, tablet systems, and handset systems, any (or all) of which can employ various embodiments of the docking solutions described herein. These docking solutions can be implemented in conjunction with the charging contact systems described in U.S. patent application Ser. No. 13/722,891 filed on a date even herewith by Yurchenco et al. and titled "Charging Contact System", which claims priority to provisional U.S. Patent Application No. 61/580,051, filed on Dec. 23, 2011, both of which are incorporated by reference herein in their entirety, and U.S. patent application Ser. No. 13/722,908 filed on a date even herewith by Switky et al. and titled "Passive Suction Base", which claims priority to provisional U.S. Patent Application No. 61/579,886, filed on Dec. 23, 2011, both of which are incorporated by reference herein in their entirety.

In accordance with some embodiments of docking/charging system 100, a docking and/or charging station (collectively referred to herein as a "docking station") might have magnets disposed therein. These magnets can impose a magnetic force on a magnetic material (such as steel, iron, or another ferromagnetic material, to name a few examples) in the electronic device (which might be, merely by way of example, a wireless handset, a mobile telephone/smartphone, music player, personal digital assistant ("PDA"), tablet computer system, and/or the like) to assist in disposing the electronic device in an appropriate position with respect to the docking station. (In another embodiment, of course, the electronic device might comprise the magnets, and the docking station might comprise the magnetic material. In yet another embodiment, the electronic device and the docking station may comprise opposite polarity magnets.)

An "appropriate" position for the electronic device can be any position in which the docking station can serve its purpose with regard to the electronic device. Merely by way of example, in some cases, the docking station might be equipped to provide electrical current to the electronic device (either for direct operation of electronic device, for charging a battery of the electronic device, etc.). As such, the docking station might have one or more electrical contacts that are configured to mate with corresponding electrical contact(s)

on the electronic device, and an appropriate position for the electronic device in such a case might be a position in which the electrical contact(s) are properly mated (e.g., touching, etc.), in order that current can flow from the docking station to the electronic device. In another case, the docking station might be equipped for data transfer with the electronic device, and when the electronic device is properly positioned, one or more data transfer pins, etc. of the docking station are properly aligned with corresponding data transfer pins, etc. of the electronic device. In some cases, an appropriate position of electronic device might include spatial positioning and/or rotational alignment of the electronic device. Merely by way of example, the docking station might have positive and negative terminals (e.g., in a charging application), and the appropriate position of the electronic device might include both the translational position of the device relative the terminals and a rotational alignment of the device, such that the positive terminal of the docking station contacts the appropriate terminal of electronic device, and the negative terminal of the docking station contacts the appropriate terminal of the electronic device.

Various embodiments can provide numerous benefits. Merely by way of example, certain embodiments can provide a user with a relatively carefree experience, in that the user need not ensure appropriate translational and/or rotational alignment of electronic device when coupling a device with the docking station. Instead, the user need only place the electronic device in sufficient proximity to the docking station to allow the magnets to impose sufficient magnetic force to attract the wireless device to the appropriate position on the docking station. Moreover, certain embodiments can obviate the need for traditional slots, notches, grooves, etc. to ensure appropriate positioning of the electronic device. Instead, the dock can be constructed in any desired fashion, while still allowing precise alignment of the electronic device to accomplish the docking function.

FIGS. 1-9 variously illustrate some of these features. The skilled reader should note that the illustrated devices and systems as shown in FIGS. 1-9 refer to examples of different embodiments that include various components that can be considered alternatives and/or can be used in conjunction with one another in the various embodiments. In some aspects, some of the various embodiments may be the same or similar embodiment. Hence, the description herein of the illustrated devices and systems as shown in FIGS. 1-9 is provided for purposes of illustration and should not be considered to limit the scope of different embodiments.

FIG. 1 is a generalized diagram illustrating a top perspective view of docking station 105 together with a bottom perspective view of a wireless handset 110, in accordance with various embodiments. (It should be appreciated that such a docking/charging system 100 could be used with a tablet computer system, a handset, or for any other type of electronic device that requires contact charging (e.g., for batteries internal to the device)). In an aspect as shown in FIG. 1, docking station 105 has a generally flat surface 105a onto which an electronic device 110 (e.g., a wireless handset) can be placed. The docking station 105 (or the surface 105a thereof) comprises a contact surface 115, charging contacts 120, and contact discs 125.

The contact surface 115 comprises a compliant material (which could include, but is not limited to, elastomeric membranes, rubber, silicone, and/or the like) that is sufficiently strong to support the weight of an electronic device 110 (such as a wireless handset, a mobile smartphone/telephone, a tablet computer, MP3 player, PDA, etc.), while providing sufficient flexibility and/or deformability to receive (and/or to damp the force applied when docking) the electronic device 110.

In some embodiments, the contact surface 115 comprises an elastomer diaphragm to provide a compliant surface on which the electronic device sits. In alternative embodiments, the contact surface 115 may be a rigid (i.e., non-compliant) surface that is either sloped or concave in shape, while the contact discs 125 comprise an elastomer diaphragm. The contact surface 115, according to some embodiments, may be molded into the surface 105a (e.g., in cases where contact surface 115 is rigid), flush-mounted with surface 105a and/or the housing of docking station 105, or mounted via brackets (not shown) in the housing of docking station 105.

The contact discs, in some embodiments, may be molded into the surface of contact surface 115, formed as part of contact surface 115 (albeit with different conditioning, e.g., different levels of doping or material infusion (as discussed in detail below)), flush-mounted with contact surface 115, or mounted via brackets (not shown) in the contact surface 115 (e.g., in cases where contact surface 115 is rigid) and/or in the housing of docking station 105.

A top surface of contact surface 115, according to some embodiments, is flush with surface 105a; in some embodiments, the top surface of contact surface 115 is recessed below surface 105a (i.e., so as to be located within an interior space of docking station 105, as shown, e.g., in FIG. 2B). According to some embodiments, charging contacts 120 are affixed to the contact surface 115 via contact discs 125, as shown in FIG. 1. Charging contacts 120, in other embodiments, are affixed directly to contact surface 115. In some embodiments, affixing the charging contacts 120 to either the contact surface 115 or the contact discs 125 may include affixing via frictional force of the elastomeric material on the surface of the charging contacts 120, affixing via adhesives (e.g., glue, bonding material, and/or the like), and/or affixing via structures in the charging contacts 120 and/or in the contact surface 115/contact discs 125 (similar to the groove 120a/contact disc 125a combination and/or the pockets 125b as shown, e.g., in FIGS. 4-5 and as discussed below).

In any case, charging contacts 120 are configured to mate with corresponding charging contacts 130 in electronic device 110. For example, the docking station 105 might be connected with a power source (such as a 110V or 220V outlet) and might include the necessary transformers, current regulators, and/or the like to condition the power for use by the electronic device 110, as appropriate. When the contacts 130 of the electronic device 110 are placed in contact with the contacts 120, current flows through the contacts to provide power to the electronic device 110. This power can be used to power the device 110 (e.g., tablet or handset, etc.), and/or charge a battery of the device 110, etc.

According to some embodiments, charging contacts 120 (or at least a top-portion thereof) are generally spherical in shape (or at least convex-hemispherical), while charging contacts 130 (or at least a bottom-portion thereof) might be concave-hemispherical, where the concave-hemispherical charging contacts 130 match or complement the convex-hemispherical charging contacts 120. In some embodiments, precise matching of the shapes of the charging contacts 120 and 130 is not necessary, so long as contact is made (e.g., the top-most point of charging contacts 120 touching some portion of the charging contacts 130 due to the electronic device 110 resting on contact surface 115 (and particularly on charging contacts 120) at least in part due to gravity, magnetic attraction, and/or the like). Although the illustrated charging contacts 120 are generally spherical in shape, the various embodiments are not so limited. The charging contacts 120 may be any shape, and in particular embodiments, any polygonal three-dimensional shape, so long as charging contacts 130 are generally of corresponding or complementary shape to mate with charging contacts 120. Each charging contact 120, according to some embodiments, may be pole-like or cylindrical with at least one rounded (or hemispherical) tip that is configured to make contact with charging contact 130. Each charging contact 120, according to other embodiments, may be pole-like or cylindrical with at least one polygonal three-dimensional shape (e.g., a triangular pyramid, square pyramid, or a cone, etc.) that mates with a correspondingly shaped charging contact 130. In alternative embodiments, charging contacts 130 might be flat, while charging contacts 120 might have a protruding point (i.e., a top portion having a shape including one of a hemisphere, rounded cone tip, or point). In such embodiments, compliance is achieved by the flat charging contacts 130 of device 110 pushing down on the protruding charging contacts 120, which might be pressed down against the flex of contact discs 125 that support charging contacts 120, such that a foot portion (or rubber foot) of device 110 mates with contact surface 115.

According to some embodiments, the contact surface 115, the charging contacts 120, and the contact discs 125 form a tight fit with the housing of the docking station 105 and with each other, to create a waterproof or water-resistant seal, maintaining a water-resistant nature of the housing while still allowing contact charging. In some cases, this fit may be sealed with a sealant as necessary to ensure water resistance. Using this technique, the electronic device 110 might have a rubber or elastomeric foot or base, which can provide several benefits (such as a compliant surface on which the electronic device 110 can sit, as well as providing friction with the contact surface 115 on which the electronic device 110 sits). The charging contacts 130 on the electronic device 110 might be assembled under compression to create a seal (i.e., a waterproof seal) between charging contacts 130 and the integral rubber foot.

Figure 2A:
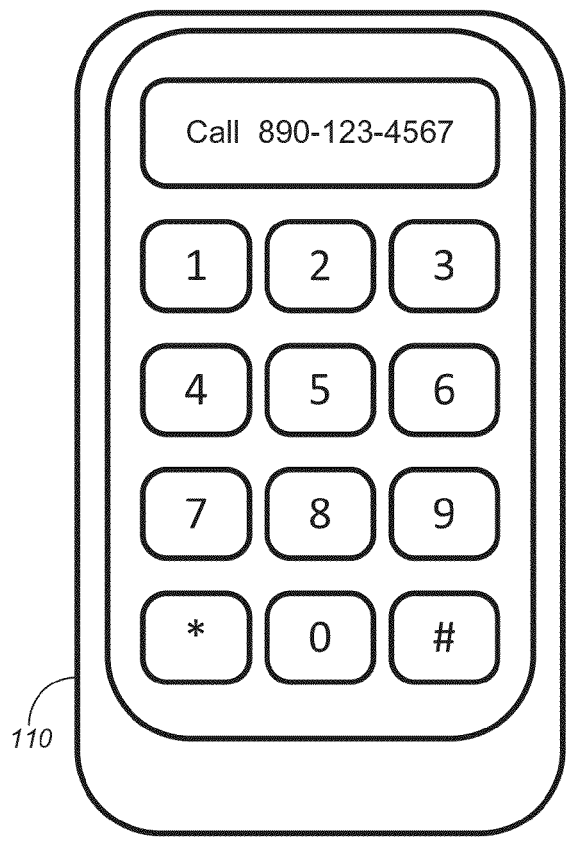
FIG. 2A is a front elevation view of a wireless handset as shown in FIG. 1, in accordance with various embodiments.
Figure 2B:
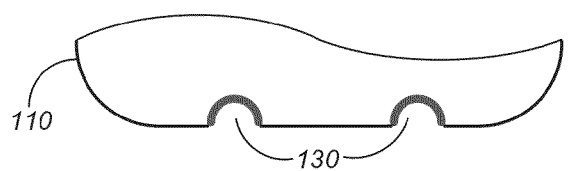
FIG. 2B is a front sectional view of a docking station and a wireless handset, in accordance with various embodiments.
Figure 2B:
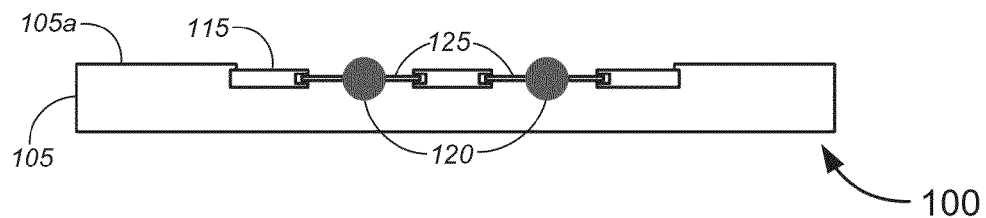

Turning to FIG. 2, FIG. 2A is a front elevation view of the wireless handset 110, e.g., as shown in FIG. 1, in accordance with various embodiments. FIG. 2B is a front sectional view of docking station 105 as shown, e.g., along section line A-A in FIG. 1 and a front sectional view of wireless handset 110 as shown, e.g., along section line B-B in FIG. 1, in accordance with various embodiments. FIG. 2B illustrates in sectional view of how the electronic device 110 (e.g., a wireless handset) can mate with docking station 105. In particular, the base of wireless handset 110 (as shown in FIG. 2A) has concave-hemispherical charging contacts 130 disposed thereon that are shaped to mate with the spherical charging contacts 120 of docking station 105. When the wireless handset 110 is placed on contact surface 115, the contact surface 115 will deform to support the weight of the wireless handset 110. If charging contacts 120 and 130 are not aligned, however, contact discs 125 can deform so that the charging contacts 120 do not tip the wireless handset off the contact surface 120, due to the charging contacts 120 protruding against the base of wireless handset 110. On the other hand, with charging contacts 120 and 130 aligned, contact surface 115 can deform sufficiently to support the weight of the wireless handset 110, while charging contacts 120 and 130 mate with each other, without deforming (or significantly deforming) contact discs 125.

Although FIG. 2B (as well as various other figures throughout this document) shows contact discs 125 being held by sandwiching portions of the thicker contact surface 115, the various embodiments are not so limited. The contact surface 115 and contact discs 125 may be of similar thickness but comprising materials having different flexibility and deformability. For example, contact surface 115 may be made of less yielding (i.e., stiffer) materials, while contact discs 125 may be made of more yielding (i.e., less stiff) materials. Thickness of the materials is only one variable that controls the differences in flexibility and deformability between the contact surface 115 and the contact discs 125. In some embodiments, the contact surface 115 and contact discs 125 may be made of a single piece of elastomeric, rubber, or silicone material, where portions thereof corresponding to the location of each of the respective components (i.e., contact surface 115 and contact discs 125) may be doped or infused with materials or chemical components (such as those known to a skilled person in the art) so as to achieve the desired variances in flexibility and deformability. Alternatively, in some cases, the contact discs 125 might be omitted, and the contact surface 115 might hold the contacts 120.

In some embodiments, contact surface 115 may be attached or affixed to surface 105a via adhesives and/or mechanical fasteners, clamps, or brackets (as may be known to those skilled in the art). Likewise, contact discs 125 may be attached or affixed to contact surface 115 via adhesives and/or mechanical fasteners, clamps, or brackets (as may also be known to those skilled in the art). Such attachment, according to some embodiments, may result in a top surface of at least one of the contact surface 115 or the contact discs 125 being flush with the surface 105a. In some embodiments, the top surface of at least one of the contact surface 115 or the contact discs 125 may be recessed below the surface 105a (i.e., so as to be within an interior space of docking station 105).

FIG. 3 shows an exemplary aspect of docking station 105, in accordance with various embodiments. FIG. 3A is a top elevation view of docking station 105, in accordance with various embodiments. FIG. 3B is a front elevation view of docking station 105, in accordance with various embodiments. As shown in FIG. 3B, from a front elevation view of the docking station 105, portions of charging contacts 120 extend in a direction normal to (i.e., orthogonal to the plane of) surface 105a.

Figure 3A:
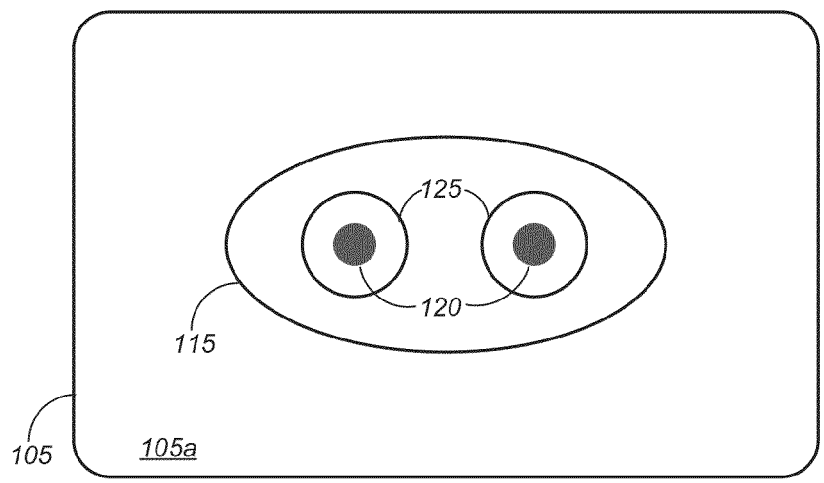
FIG. 3A is a top elevation view of a docking station, in accordance with various embodiments.
Figure 3B:
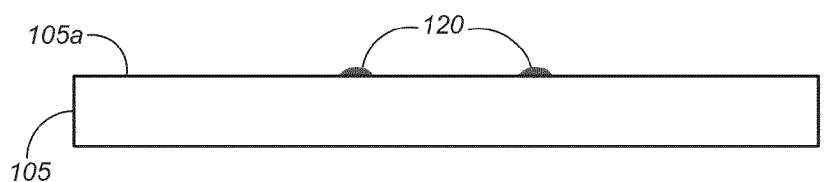
FIG. 3B is a front elevation view of a docking station, in accordance with various embodiments.
Figure 3C:
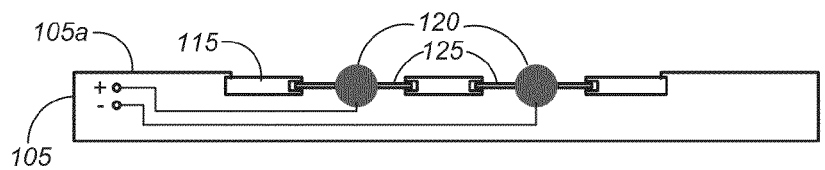
FIG. 3C is a front sectional schematic diagram of a docking station, in accordance with various embodiments.

FIG. 3C is a front sectional schematic diagram of a docking station 105 as shown, e.g., along the A-A section line in FIG. 1, in accordance with various embodiments. In various embodiments as illustrated by FIG. 3C, one of the charging contacts 120 is operatively coupled to a positive (+) terminal, while the other of the charging contacts 120 is operatively coupled to a negative (−) terminal, in order to supply current to an electronic device 110 that is docked with docking station 105 for the purpose of powering the electronic device 110 and/or charging batteries housed therein. Operative coupling of the charging contacts 120 to the positive/negative terminals may, in some embodiments, be achieved via wires that are electrically affixed to respective charging contacts 120, as shown in FIG. 3C. In some alternative embodiments, each of the wires that are connected to one of the positive or negative terminals may be attached to a corresponding metal spring (or telescoping platform or cylinder) that makes contact with a respective one of charging contacts 120. The springs may be biased between an inner surface of the docking station 105 and the charging contacts 120, and may provide additional support to the contact surface 115 when an electronic device 110 is docked with the docking station 105.

Figure 3D:
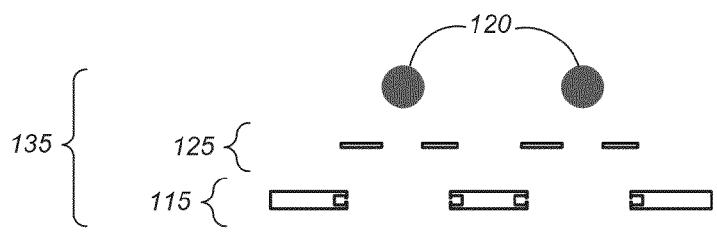
FIG. 3D is an exploded view of a contact attachment, in accordance with various embodiments.

FIG. 3D is an exploded view of contact attachment 135 as shown in FIG. 3C, in accordance with various embodiments. In FIGS. 3C and 3D, contact attachment 135 comprises contact surface 115 fitted with two contact discs 125, where the contact discs 125 are affixed to the charging contacts 120. In some embodiments, contact attachment 135 may comprise only contact surface 115, which can be directly affixed to charging contacts 120. In such embodiments, contact surface 115 may be doped or infused with materials or chemical components that allow the portions making direct contact with charging contacts 120 to have greater flexibility and deformability (i.e., lesser stiffness) compared to the rest of contact surface 115, which should be configured to be sufficiently stiff in order to support the weight of an electronic device 110 (such as, but not limited to, a mobile phone, a telephone handset, a tablet computer, or a PDA, etc.). Further, as discussed above with respect to FIG. 2B, the thicknesses of the contact surface 115 and the contact discs 125 may, in some embodiments, be similar, rather than the thickness of contact surface 115 being significantly greater than that of each contact disc 125, as shown in FIG. 3D.

Figure 4A:
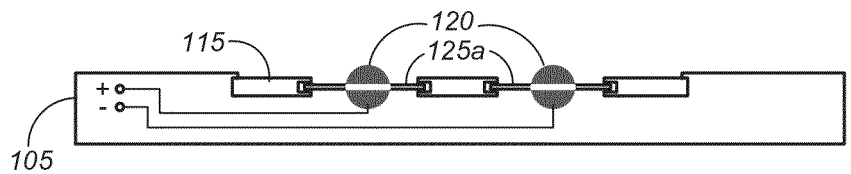
FIG. 4A is a front sectional schematic diagram of another aspect of a docking, in accordance with various embodiments.
Figure 4B:
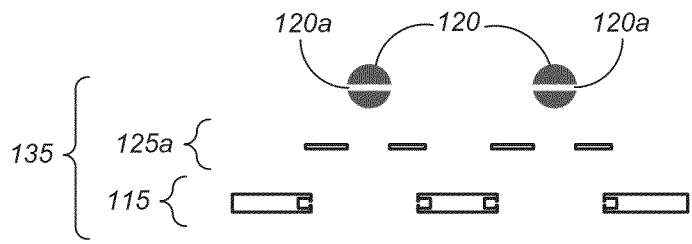
FIG. 4B is an exploded view of a contact attachment, in accordance with various embodiments.

Certain embodiments might provide features in the contact discs 125 and/or the charging contacts 120 to enhance the mechanical interaction between the discs 125 and the contacts 120. Merely by way of example, FIGS. 4 and 5 show two alternative embodiments for attaching or affixing contact discs 125 to charging contacts 120. FIG. 4A is a front sectional schematic diagram of another aspect of docking station 105 as shown, e.g., along the A-A direction in FIG. 1, in accordance with various embodiments. FIG. 4B is an exploded view of contact attachment 135 as shown in FIG. 4A, in accordance with various embodiments. In the set of embodiments as shown in FIG. 4, a circumferential groove 120a is provided in each of charging contacts 120 (preferably about the middle portion thereof), while each of contact discs 125a is configured to have an opening thereof that is smaller than the width (or in the case of a spherical or cylindrical pin, the diameter) of each charging contact 120. As shown in FIG. 4, when spherical charging contacts 120 having grooves 120a therein are fitted in the annular openings of contact discs 125a, a snug fit is achieved that prevents charging contacts 120 from accidentally becoming disconnected from contact discs 125a. This snug fitting also creates a water-proof seal. Although charging contacts 120 are shown having a generally spherical shape, and with a circular groove about the middle portion thereof, the various embodiments are not so limited. For example, charging contacts 120 may be of any polygonal shape (including, but not limited to, a square prism-shaped pin or cylindrical pin having a contact tip in the shape of a polygonal three-dimensional shape (e.g., a hemisphere, a triangular pyramid, square pyramid, or a cone, etc.)), and may have either a circular middle portion/circumference or a middle portion of other polygonal shape. In such embodiments, contact discs 125a would be configured to have a corresponding shape, albeit smaller in opening than the width/diameter of the middle portion of each charging contact 120 (including, but not limited to, groove 120a), such that a snug fit can be achieved between charging contacts 120 and contact discs 125a.

Figure 5A:
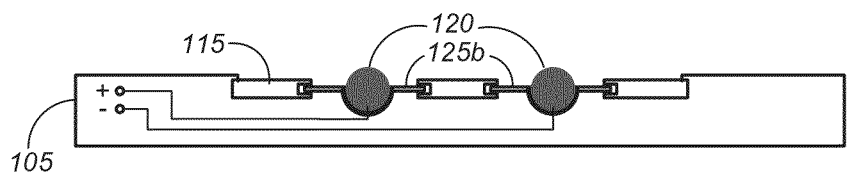
FIG. 5A is a front sectional schematic diagram of yet another aspect of a docking station, in accordance with various embodiments.
Figure 5B:
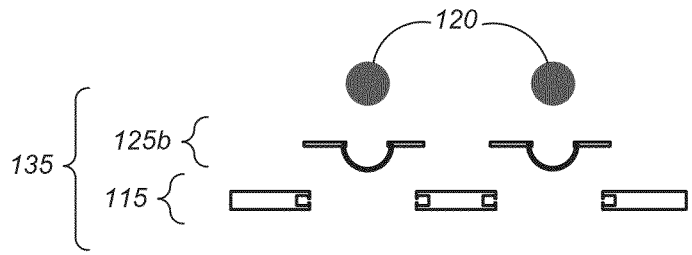
FIG. 5B is an exploded view of a contact attachment, in accordance with various embodiments.
Figure 6A:
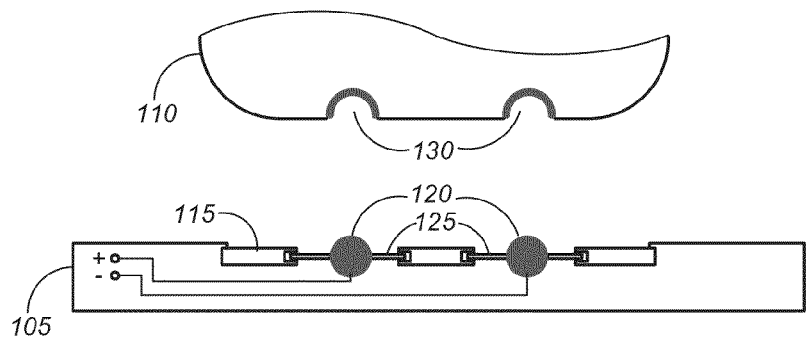
FIGS. 6A-6B are diagrams illustrating an example of magnetic docking, in accordance with various embodiments.
Figure 6B:
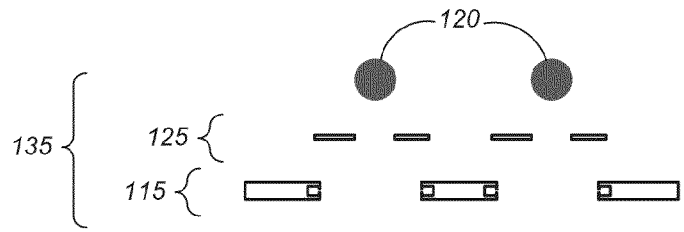

FIG. 5A is a front sectional schematic diagram of yet another embodiment of a docking station 105 as shown, e.g., along the A-A section line in FIG. 1, in accordance with various embodiments. FIG. 5B is an exploded view of a contact attachment 135 as shown in FIG. 5A, in accordance with various embodiments. FIG. 5 shows another set of embodiments for affixing or attaching charging contacts 120 to contact discs 125. In FIG. 5, a pocket is provided in each contact disc 125b that conforms to the shape of a bottom portion of each charging contact 120. For example, as shown in the embodiments of FIG. 5, concave-hemispherical pockets (similar in shape to the concave-hemispherical charging contacts 130 in electronic devices 110, as shown, e.g., in FIG. 2B) are provided in contact discs 125b that conform to the spherical shape of the charging contacts 120. In some embodiments, the pockets are configured such that the depth of the pocket is slightly greater than a radius of a charging contact 120, such that the width of the charging contact 120 is held snugly by the pocket of contact disc 125b. The pockets, according to various embodiments may be formed from the single piece of material used to form contact discs 125, or may be bonded/adhered to contact discs 125 to form pocketed contact discs 125b. According to some embodiments, the pockets may be any shape that conforms with the shape of the charging contacts (e.g., conical, square prism-shaped, etc.); in some embodiments, conical or square prism-shaped charging contacts 120 may have bottom portions that are one of rounded/hemispherical, triangular pyramidal, square pyramidal, or conic, etc.). The pockets, in some embodiments, form a snug fitting with the contact discs 125b and the charging contacts 120 to form a water-proof seal. The pockets might feature an opening to allow a wire, spring, and/or the like to provide or allow electrical communication between each of the positive/negative (+/−) terminals and each corresponding contact 120. In accordance with some embodiments, especially in the cases where the depth of the pocket is approximately the same as the radius of a charging contact 120, the embodiments of FIGS. 4 and 5 may be combined to ensure that the charging contacts 120 remain in relative position with contact discs 125 (or with contact surface 115 in the cases that contact discs 125 are omitted and the pockets are formed with contact surface 115).

FIGS. 6-9 show four examples of embodiments for magnetic docking. FIGS. 6A-6B are diagrams illustrating a first example of magnetic docking, in accordance with various embodiments. The magnetic docking embodiments of FIGS. 6-9 may be combined with any combination of the contact attachment embodiments as shown and discussed above with respect to FIGS. 1-5.

In FIG. 6, charging contacts 120 of docking station 105 comprise magnets, which are coupled to magnetic material in charging contacts 130 of electronic device 110. Magnetic materials may include (but are not limited to) steel, iron, or another ferromagnetic material, etc. Alternatively, the charging contacts 130 may comprise magnets, while charging contacts 120 of the docking station 105 may comprise the magnetic material to which said magnets are coupled.

Figure 7A:
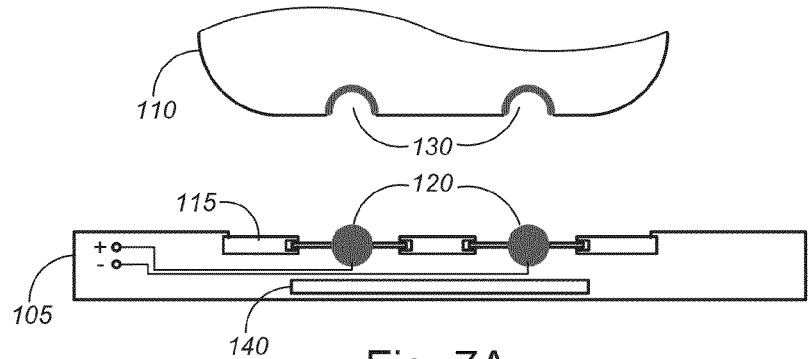
FIGS. 7A-7B are diagrams illustrating an example of magnetic docking, in accordance with various embodiments.
Figure 7B:
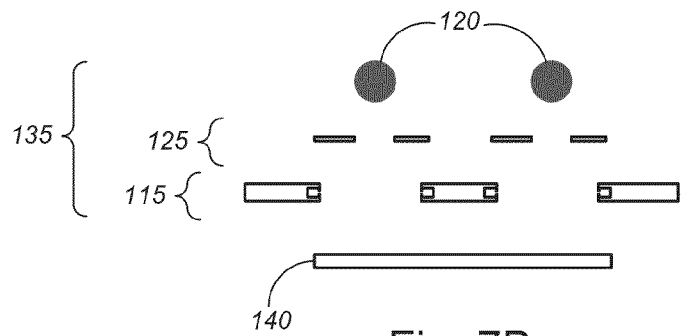

FIGS. 7A-7B are diagrams illustrating a second example of magnetic docking, in accordance with various embodiments. In FIG. 7, a plate 140, which comprises one or more magnets, is provided within the housing of docking station 105, positioned approximately below contact surface 115 (i.e., below where an electronic device 110 may be docked). The one or more magnets of plate 140 can be coupled to magnetic material in charging contacts 130 of (or in a corresponding plate(s) housed within) electronic device 110. As mentioned above, magnetic materials may include (but are not limited to) steel, iron, or another ferromagnetic material, etc. Alternatively, the charging contacts 130 (or corresponding plate(s) housed within electronic device 110) may comprise magnets, while plate 140 may comprise the magnetic material to which said magnets are coupled. Plate 140, according to various embodiments, may be of any shape, but preferably of a shape (e.g., a bar, an annulus, a disc, a button, a cube, etc.) that facilitates magnetic coupling with the magnet(s) or corresponding plate(s) in electronic device 110.

Figure 8A:
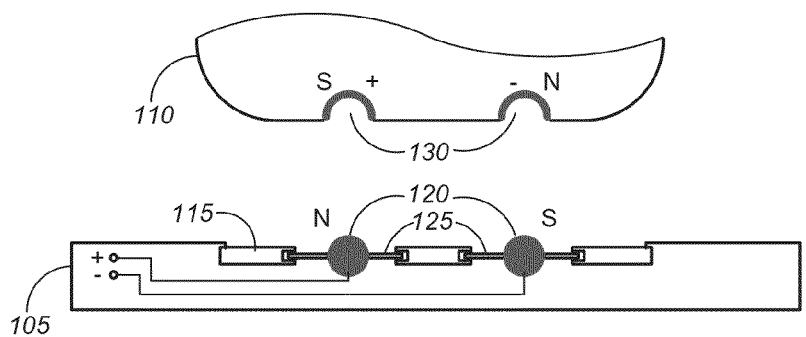
FIGS. 8A-8B are diagrams illustrating an example of magnetic docking, in accordance with various embodiments.
Figure 8B:
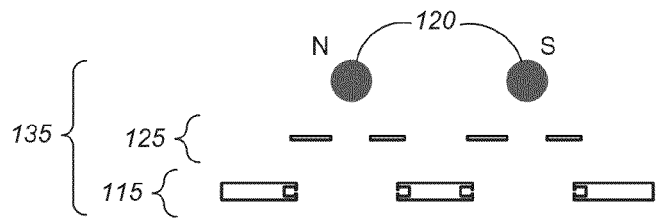

FIGS. 8A-8B are diagrams illustrating a third example of magnetic docking, in accordance with various embodiments. In FIG. 8, both the charging contacts 120 and the charging contacts 130 comprise magnets. The magnets, however, are of differing magnetic polarity. For example, as shown in FIG. 8A, the charging contact 120 that is operatively coupled to the positive (+) terminal comprises a magnet having its north pole (N) positioned external to the docking station 105, such that it can be closest to an electronic device 110 that may be docked with it. The charging contact 130 that is coupled with a corresponding positive (+) terminal comprises a magnet having its south pole (S) positioned external to the electronic device 110, such that it can be closest to the docking station 105 to which it may be docked. In this way, for the positive (+) terminals, the north pole of the magnet of charging contact 120 may be attracted to the south pole of the magnet of charging contact 130 when the two charging contacts are brought close to each other.

Likewise, the charging contact 120 that is operatively coupled to the negative (−) terminal comprises a magnet having its south pole (S) positioned external to the docking station 105, such that it can be closest to an electronic device 110 that may be docked with it. The charging contact 130 that is coupled with a corresponding negative (−) terminal comprises a magnet having its north pole (N) positioned external to the electronic device 110, such that it can be closest to the docking station 105 to which it may be docked. In this way, for the negative (−) terminals, the south pole of the magnet of charging contact 120 may be attracted to the north pole of the magnet of charging contact 130 when the two charging contacts are brought close to each other.

As understood by those skilled in the art, permanent magnets each have a north and a south pole. Although it is shown in FIG. 8 that each magnet (for each of charging contacts 120 and 130) has only a north (N) or a south (S) pole, such notations are only indicative of which pole is external to each of docking station 105 and electronic device 110. The other pole is internal, and thus not indicated in the figures. For example, in FIG. 8A, the charging contact 120 that is connected to the positive (+) terminal has both a north pole (N) and a south pole (S). The north pole (N) of this charging contact 120 faces an electronic device 110 that may dock with docking station 105, while the south pole faces the bottom interior portion of the docking station 105; the south pole (S) may also be in direct contact with a wire or other conduit that is coupled to the positive (+) terminal. The other charging contacts 120 and 130 are similarly configured, with the respective charging contacts configured and positioned such that the north/south magnetic poles that are not indicated in FIG. 8A face an interior portion of the docking station 105 or electronic device 110.

Figure 9A:
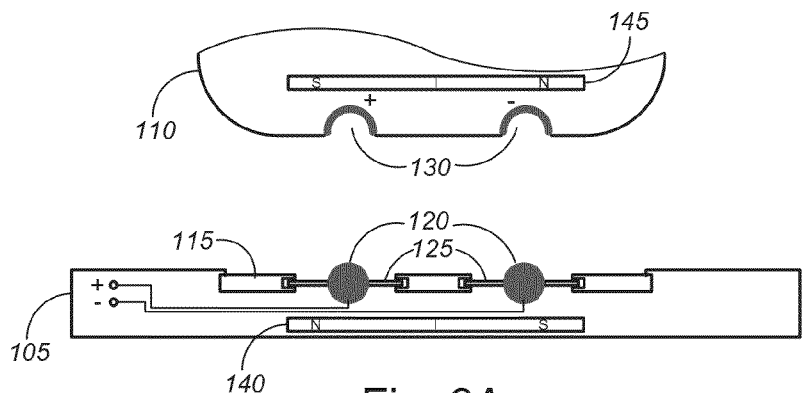
FIGS. 9A-9B are diagrams illustrating an example of magnetic docking, in accordance with various embodiments.
Figure 9B:
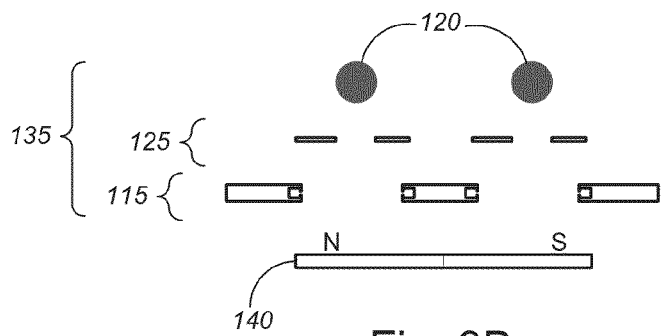

FIGS. 9A-9B are diagrams illustrating a fourth example of magnetic docking, in accordance with various embodiments. The fourth example is similar to the third example, except that rather than the charging contacts 120 or 130 comprising magnets, additional magnets 140 and 145 are provided within the housing of the docking station 105 and an electronic device 110, respectively. Magnet 140 is configured and positioned such that the north pole (N) of magnet 140 in docking station 105 is located under and/or close to the charging contact 120 that is electrically coupled to the positive (+) terminal, while the south pole (S) of magnet 140 is located under and/or close to the charging contact 120 that is electrically coupled to the negative (−) terminal. Correspondingly, magnet 145 is configured and positioned such that the south pole (S) of magnet 145 in electronic device 110 is located above and/or close to the charging contact 130 that is electrically coupled to the positive (+) terminal, while the north pole (N) of magnet 145 is located above and/or close to the charging contact 130 that is electrically coupled to the negative (−) terminal. According to some embodiments, magnet 140 and/or magnet 145 may each comprise one or more magnets. Magnets 140 and 145 may be of any shape, but preferably of shapes that facilitate magnetic coupling (i.e., where a magnetic field created by magnet 140 matches a magnetic field created by magnet 145).

With reference to the embodiments as shown in FIGS. 6-9, the one or more magnets in docking station 105 interact with the magnetic material in the electronic device 110 to position the electronic device 110 so that charging contacts 130 on the electronic device 110 are coupled with (i.e., in this case, touching) the corresponding contacts 120 on the docking station 105.

In the examples of FIGS. 8-9, in particular, because one or more magnets (i.e., magnets in charging contacts 120 and 130, or the magnets 140 and 145) have opposite (north/south) polarity at or near the positive (+) terminals of the docking station 105 and the electronic device 110, while the one or more magnets have opposite (south/north) polarity at or near the negative (−) terminals of the docking station 105 and the electronic device 110, the positive (+) terminals (i.e., the charging contacts 120 and 130 coupled to the positive terminals) can make contact with each other when close by, while the negative (−) terminals (i.e., the charging contacts 120 and 130 coupled to the negative terminals) can make contact with each other when similarly close by. Because of this difference in magnetic polarity, if the negative (−) terminal of the electronic device 110 were to be brought close to the positive (+) terminal of the docking station 105, the north poles of the corresponding magnets will repel each other, thus preventing inadvertent cross-terminal contact (i.e., the negative terminal of device/dock contacting the positive terminal of the dock/device). Similarly, inadvertent cross-terminal contact may be prevented even if the positive (+) terminal of the electronic device 110 were to be brought close to the negative (−) terminal of the docking station 105, because the south poles of the corresponding magnets will repel each other. Such a configuration allows for an elegant design of the device/dock system that allows for spatial positioning and/or rotational alignment of the electronic device, while obviating any need for grooves, slots, notches, or other types of structures for preventing cross-terminal contact.

In some embodiments, the magnetic polarity may be switched compared to the embodiments as shown in FIGS. 8-9. For example, the charging contact 120 that is operatively coupled to the positive (+) terminal may comprise a magnet having its south pole (S) positioned external to the docking station 105, such that it can be closest to an electronic device 110 that may be docked with it, where the charging contact 130 that is coupled with a corresponding positive (+) terminal may comprise a magnet having its north pole (N) positioned external to the electronic device 110, such that it can be closest to the docking station 105 to which it may be docked, and so on.

According to some embodiments, the shapes of the two charging contacts 120 may be different, each charging contact 120 matching with a correspondingly different (and matching) charging contact 130. For example, a top portion of the charging contact 120 that is operatively coupled to the positive (+) terminal may be convex-hemispherical, while the top portion of the charging contact 120 that is operatively coupled to the negative (−) terminal may be pyramidal. Correspondingly, the bottom portion of the charging contact 130 that is operatively coupled to the positive (+) terminal may be concave-hemispherical, while the bottom portion of the charging contact 130 that is operatively coupled to the negative (−) terminal may be inverse-pyramidal. Such differences in shapes of the positive and negative terminal pairs of charging contacts 120, 130 may be configured either alone or in any combination with the embodiments of FIGS. 1-9 (as discussed above), to prevent inappropriate mating of the contacts (i.e., cross-terminal contacts by a positive terminal of one of the docking station and the electronic device with a negative terminal of the other of the docking station and the electronic device). Any shape of the top portion of the charging contacts 120, 130 (e.g., hemispherical, triangular pyramidal, square pyramidal, or conical, etc.) may be implemented, so long as the positive terminal pairs are of one shape while the negative terminal pairs are of another shape different from the first shape.

Although FIGS. 6-7 show either the docking station 105 or the electronic device 110 comprising one or more magnets, while the other comprises the magnetic material, the various embodiments are not so limited. The docking station 105 and the electronic device 110 may each comprise at least one magnet and/or at least one magnetic material. For example, the at least one magnet may be located near (or within) the charging contact 120 that is operatively coupled to the positive (+) terminal, while at least one magnetic material may be located near (or within) the charging contact 120 that is operatively coupled to the negative (−) terminal, and vice versa. Correspondingly, the at least one magnetic material may be located near (or within) the charging contact 130 that is operatively coupled to the positive (+) terminal, while at least one magnet may be located near (or within) the charging contact 130 that is operatively coupled to the negative (−) terminal, and vice versa.

Various embodiments can provide other benefits as well. For instance, as shown by FIGS. 1-9, the elimination of any need for alignment slots or grooves allows the electronic device 110 to be removed quickly and easily from the docking station 105 in any direction (e.g., above surface 105a) without concern for breaking the docking station 105 or the electronic device 110. Further, if the handset is displaced slightly, the electronic device 110 will wobble (due to the flexible and deformable membrane of contact surface 115 and/or contact discs 125) but will not fall over, and thus will maintain (or re-attain) its proper position to allow continued coupling with the docking station. The magnetic docking as shown in the exemplary embodiments of FIGS. 6-9 (and/or the differently shaped positive/negative terminal pairs as discussed above) further facilitate this coupling. This wobbling behavior might also be induced when the electronic device 110 is docked, as the magnets in the docking station 105 attract the handset 110 to the appropriate position (e.g., as discussed above with respect to FIGS. 6-9, and more particularly, with respect to FIGS. 8-9).

While certain features and aspects have been described with respect to exemplary embodiments, one skilled in the art will recognize that numerous modifications are possible. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture but instead can be implemented on any suitable hardware, firmware and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with—or without—certain features for ease of description and to illustrate exemplary aspects of those embodiments, the various components and/or features described herein with respect to a particular embodiment can be substituted, added and/or subtracted from among other described embodiments, unless the context dictates otherwise. Consequently, although several exemplary embodiments are described above, it will be appreciated that the invention is intended to cover all modifications and equivalents within the scope of the following claims.

What is claimed is:

1. A coupling system for a docking station, the coupling system comprising:
 a first material in the docking station; and
 a second material in the electronic device;
 wherein the first material and the second material interact magnetically to align the electronic device in an appropriate position with respect to the docking station,
 wherein the docking station comprises a first set of electrical contacts and a first set of elastomeric diaphragms, wherein a surface of the docking station comprises one or more openings, and wherein each elastomeric diaphragm of the first set of elastomeric diaphragms fills and forms a seal about each of said one or more openings,
 wherein the first set of elastomeric diaphragms comprises an opening corresponding to each electrical contact and a pocket forming a pocket seal about each opening of the first set of elastomeric diaphragms.

2. The coupling system of claim 1, wherein the first material comprises one or more magnets, and wherein the second material comprises a ferromagnetic material.

3. The coupling system of claim 1, wherein the second material comprises one or more magnets, and wherein the first material comprises a ferromagnetic material.

4. The coupling system of claim 1, wherein the first material comprises one or more first magnets and the second material comprises one or more second magnets, wherein a portion of the one or more first magnets that is proximate to the one or more second magnets comprises magnets of a first magnetic polarity and a portion of the one or more second magnets that is proximate to the one or more first magnets comprises magnets of a second magnetic polarity, wherein the first magnetic polarity and the second magnetic polarity are opposite magnetic polarities.

5. The coupling system of claim 1, wherein the electronic device comprises a second set of electrical contacts, and wherein the appropriate position of the electronic device provides for electrical coupling between the first set of electrical contacts and the second set of electrical contacts.

6. The coupling system of claim 5, wherein the first set of electrical contacts comprises the first material, and wherein the second set of electrical contacts comprises the second material.

7. The coupling system of claim 5, further comprising:
 a first plate in the docking station, the first plate comprising the first material; and a second plate in the electronic device, the second plate comprising the second material.

8. The coupling system of claim 5, wherein the docking station further comprises a flat top surface above which the first set of electrical contacts protrudes from an interior portion of the docking station.

9. The coupling system of claim 8, wherein each elastomeric diaphragm forms a seal about each electrical contact of the first set of electrical contacts, wherein the flat top surface includes the surface of the docking station that comprises the one or more openings, and wherein the electronic device is configured to rest on the first set of elastomeric diaphragms when in the appropriate position.

10. The coupling system of claim 9, wherein the first set of elastomeric diaphragms comprises a first portion having a first flexibility and a second portion having a second flexibility, the second portion forming the seal about each electrical contact of the first set of electrical contacts, the first portion filling and forming the seal about each of said one or more openings in the flat top surface, wherein the first flexibility is less than the second flexibility.

11. The coupling system of claim 9, wherein the first set of elastomeric diaphragms comprises a second elastomeric diaphragm having openings therein corresponding to each electrical contact of the first set of electrical contacts and a third elastomeric diaphragm corresponding to each electrical contact of the first set of electrical contacts formed in the openings of the second elastomeric diaphragm, wherein the second elastomeric diaphragm has a first flexibility and each of the third elastomeric diaphragm has a second flexibility, the third elastomeric diaphragm forming the seal about each electrical contact of the first set of electrical contacts, the second elastomeric diaphragm filling and forming the seal about each of said one or more openings in the flat top surface, wherein the first flexibility is less than the second flexibility.

12. The coupling system of claim 11, wherein the second elastomeric diaphragm has a first thickness and each of the third elastomeric diaphragms has a second thickness, wherein the first thickness and the second thickness are different.

13. The coupling system of claim 9, wherein each electrical contact of the first set of electrical contacts comprises a groove about a perimeter of a middle portion thereof and wherein the first set of elastomeric diaphragms comprises an opening corresponding to each electrical contact, each opening having a width smaller than a width of each groove so as to form the seal about each electrical contact of the first set of electrical contacts.

14. The coupling system of claim 5, wherein the first set of electrical contacts comprises a first positive terminal contact having a first shape and a first negative terminal contact having a second shape, wherein the second set of electrical contacts comprises a second positive terminal contact having a third shape and a second negative terminal contact having a fourth shape, wherein the first shape matches and complements the third shape, and wherein the second shape matches and complements the fourth shape, such that the first set of electrical contacts mates with the second set of electrical contacts.

15. The coupling system of claim 14, wherein the first shape and the second shape are the same shape, and wherein the third shape and the fourth shape are the same shape.

16. The coupling system of claim 14, wherein the first shape and the second shape are different shapes, and wherein the third shape and the fourth shape are different shapes.

17. The coupling system of claim 1, wherein each pocket has a shape that conforms to a shape of a portion of each electrical contact of the first set of electrical contacts that is positioned between the first set of elastomeric diaphragms and an inner bottom portion of the docking station, so as to form the seal about each electrical contact of the first set of electrical contacts, wherein each pocket includes an opening to allow electrical communication between each electrical contact of the first set of electrical contacts and corresponding terminals of a power source that are located within an interior portion of the docking station.

18. A docking station for an electronic device, the docking station comprising:
    a first set of electrical contacts;
    a coupling system configured to magnetically align an electronic device in an appropriate position relative to the docking station, the electronic device comprising a second set of electrical contacts, the appropriate position providing for electrical coupling between the first set of contacts and the second set of contacts;
    a surface comprising one or more openings; and
    a first set of elastomeric diaphragms, wherein each elastomeric diaphragm of the first set of elastomeric diaphragms fills and forms a seal about each of said one or more openings,
    wherein the first set of elastomeric diaphragms comprises an opening corresponding to each electrical contact of the first set of electrical contacts and a pocket forming a pocket seal about each opening of the first set of elastomeric diaphragms.

19. The docking station of claim 18, wherein the coupling system comprises:
    a first material configured to interact magnetically with a second material in the electronic device, to align the electronic device in the appropriate position.

20. The docking station of claim 18, further comprising:
    a first data transfer contact configured to interact electrically with a second data transfer contact in the electronic device, to transfer data between the docking station and the electronic device.

* * * * *